United States Patent
Yuan et al.

[11] Patent Number: 6,130,517
[45] Date of Patent: Oct. 10, 2000

[54] MAGNETIC ACTUATOR PRODUCING LARGE ACCELERATION ON FINE STAGE AND LOW RMS POWER GAIN

[75] Inventors: Bausan Yuan, San Jose; Ting-Chien Teng, Fremont, both of Calif.

[73] Assignee: Nikon Corporation, Belmont, Calif.

[21] Appl. No.: 09/022,713

[22] Filed: Feb. 12, 1998

[51] Int. Cl.$^7$ .............................. G05B 5/01; G05B 11/18
[52] U.S. Cl. ........................ 318/640; 318/632; 318/593
[58] Field of Search ................... 318/560–696; 250/492.2, 441.1, 442.1; 364/167.01; 104/284, 283, 281; 360/78.05, 165; 474/720–732

[56] References Cited

U.S. PATENT DOCUMENTS

| | | | |
|---|---|---|---|
| 3,889,164 | 6/1975 | Nishizawa et al. | 318/640 |
| 4,280,083 | 7/1981 | Hirai et al. | 318/565 |
| 4,477,729 | 10/1984 | Chang et al. | 250/492.2 |
| 4,528,451 | 7/1985 | Petric et al. | 250/441.1 |
| 4,641,071 | 2/1987 | Tazawa et al. | 318/640 |
| 5,013,987 | 5/1991 | Wakui | 318/632 |
| 5,153,494 | 10/1992 | Hollis, Jr. | 318/640 |
| 5,172,160 | 12/1992 | Van Eijk et al. | 355/53 |
| 5,227,948 | 7/1993 | Boon et al. | 361/144 |
| 5,249,118 | 9/1993 | Smith | 364/167.01 |
| 5,360,470 | 11/1994 | Ono et al. | 104/284 |
| 5,808,435 | 9/1998 | Mager | 318/593 |

*Primary Examiner*—Paul Ip
*Attorney, Agent, or Firm*—Skjerven, Morrill, MacPherson, Franklin and Friel

[57] ABSTRACT

A pair of complementary magnetic actuators controls a stage in a high-precision positioning instrument in a single coordinate direction. Additional pairs of complementary magnetic actuators can be used to provide control of the stage in other coordinate directions. A small current through the windings of both magnetic actuators provides a zero net force on the fine stage, thus maintaining the position of the fine stage. The small current used to control the fine stage minimizes the RMS power gain. By increasing the current in one magnetic actuator while decreasing the current in the other, a net force is generated for large accelerations of the stage. Control of the magnetic actuators is simplified by simultaneously increasing and decreasing the current through the windings of the complementary magnetic actuators prior to accelerating the stage. Additionally, a feedforward command can control the magnetic actuators to decrease the settling time of the system.

27 Claims, 4 Drawing Sheets

MAGNETIC ACTUATOR PRODUCING LARGE ACCELERATION ON FINE STAGE AND LOW RMS POWER GAIN

FIELD OF THE INVENTION

The present invention relates to a position control apparatus for controlling the fine stage in a high-precision positioning instrument and more particularly, the present invention relates to controlling a fine stage using magnetic actuators.

BACKGROUND

High-precision positioning instruments are used to drive stages to desired positions in a fast and accurate manner. Typically, high-precision positioning instruments use a coarse and fine stage arrangement, wherein the fine stage is carried by the coarse stage. The coarse stage quickly moves from one position to the next, while the fine stage precisely positions the device.

Various well known mechanisms are used to drive the stages in a high-precision positioning instrument. For instance, conventional coarse and fine stages are often driven with linear servo actuators or electro-mechanical stepping motors. These mechanisms, however, have disadvantages including slow acceleration of the stages, producing an undesirable amount of heat, and being difficult to precisely control.

Another mechanism used to drive the stages in a high-precision positioning instrument is a magnetic actuator. A magnetic actuator uses an electro-magnet to move a stage from one position to another. A current transmitted through windings in the magnetic actuator generates the magnetic force used to accelerate the stage. The amount of force used to move the stage in the desired manner is controlled by generating the appropriate amount of current. Unfortunately, conventional methods of controlling magnetic actuators are imprecise because the force generated by a magnetic force falls off in a non-linear manner relative to the distance between the actuator and the object being controlled. Previous attempts to precisely control conventional magnetic actuators have resulted in a small quantity of force or a slow acceleration of the stages and the generation of excessive RMS (root mean square) power gains, which produces heat. Consequently, magnetic actuators are not typically used in conventional high-precision positioning instruments.

SUMMARY

In accordance with the present invention, a pair of complementary magnetic actuators is used to control a stage (e.g. a fine motion or "fine" stage) in a high-precision positioning instrument. A magnetic actuator accelerates the stage with a controlled force in one direction, while a complementary magnetic actuator accelerates the stage with a controlled force in the opposite direction. When the forces produced by the magnetic actuators are the same, there is zero net force on the stage and, thus, no acceleration of the stage. However, when a force produced by one of the magnetic actuators is greater than the other, the net force on the stage accelerates the stage towards the magnetic actuator having the greater force. Thus, the stage can be controlled in a single coordinate direction by using a pair of complementary magnetic actuators. Additional complementary magnetic actuators can be used to control the fine stage with up to six degrees of freedom.

Generally, a magnetic actuator suitable for use in accordance with this invention exerts a highly controllable magnetic force without physically contacting the object on which the forces are exerted. One example of a magnetic actuator used in accordance with the present invention is known as an e/i core actuator.

A constant current is used to maintain precise control over the complementary magnetic actuators. It is desirable, however, to maintain only a small constant current in the windings of the complementary magnetic actuators to prevent RMS power gain. In accordance with one embodiment of the present invention, when there is a desired acceleration of the stage, the current in the complementary magnetic actuators is simultaneously increased. The current can then be changed in the complementary magnetic actuators by an equal and opposite amount to produce a large acceleration of the stage. Changing the current in the complementary magnetic actuators by an equal and opposite amount results in a large acceleration of the stage while simplifying control of the magnetic actuators. Additionally, a feedforward command can be used to control magnetic actuators to decrease the settling time of the high-precision positioning instrument.

BRIEF DESCRIPTION OF THE DRAWINGS

The above and other features, aspects, and advantages of the present invention will become better understood with regard to the following description, appended claims, and accompanying figures, where:

DETAILED DESCRIPTION

Figure 1:
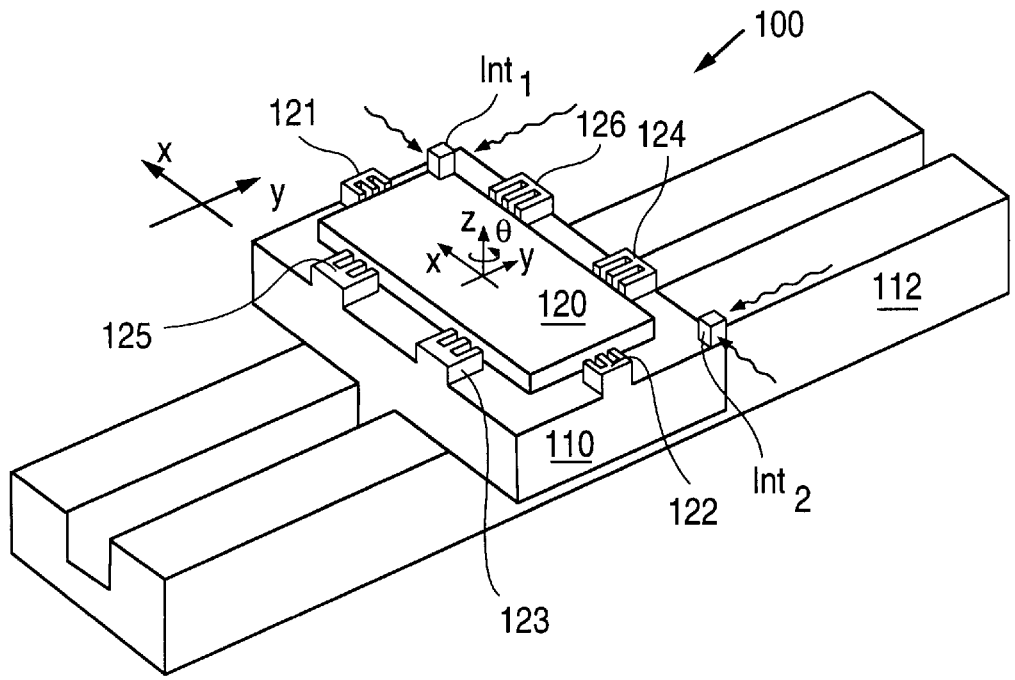
FIG. 1 is a perspective view of a high-precision positioning instrument with a coarse stage and a fine stage controlled with e/i core actuators.

FIG. 1 is a perspective view of a high-precision positioning instrument 100, which is supported by a conventional anti-vibration structure (not shown) and includes a coarse stage 110 and a fine stage 120. Course stage 110 is driven in the Y coordinate direction by a linear servo motor 112 and ball screws, or other appropriate actuators and is supported vertically by anti-friction bearings, such as air bearings or roller bearings, as is well known in the art. Coarse stage 110 may also be driven in a similar manner in the X coordinate direction.

Fine stage 120 is supported on coarse stage 110 by anti-friction bearings, such as air bearings or roller bearings. Fine stage 120 carries the object (not shown) to be positioned in a conventional manner. A semiconductor wafer, for example, may be mounted on fine stage 120 for exposure in a photolithographic system. It is understood, however, that the present invention applies to any high-precision positioning systems.

Magnetic actuators, in the form of six e/i core actuators 121–126, are used to control the position of fine stage 120 relative to coarse stage 110. As illustrated in FIG. 1, the e/i core actuators 121–126 are positioned in complementary pairs around fine stage 120 such that fine stage 120 can move with three degrees of freedom in the X, Y and $\Theta_Z$ coordinate directions. (These directions are illustrated and are not part of the structure.) With additional e/i core actuators (not shown) positioned above and below fine stage 120, however, fine stage 120 may move with six degrees of freedom relative to coarse stage 110, which would obviate the need for an anti-friction bearing between fine stage 120 and coarse stage 110. Although, e/i core actuators are used in the description of the present invention, it is understood that other magnetic actuators may also be used, such as voice coil motors.

A position sensor $Int_1$ is located on fine stage 120. Position sensor $Int_1$ is, for example, an interferometer that senses the actual position of fine stage 120 relative to a stationary object (not shown) such as a projection lens. Of course position sensor $Int_1$ may be any other appropriate type of sensor such as a linear encoder. Position sensor $Int_1$ senses the location of a corner of fine stage 120 in the X and Y coordinate directions. It is understood that additional positional sensors may be used to more accurately determine the location of fine stage 120, including the position of fine stage 120 in the Z coordinate direction. A second position sensor $Int_2$ is shown on coarse stage 110. Position sensor $Int_2$, likewise, is an interferometer or other appropriate measuring device, which measures the actual position of coarse stage 110 relative to a stationary object. As described below in reference to FIG. 10, position sensor $Int_2$ need not be used in some embodiments.

Figure 2:
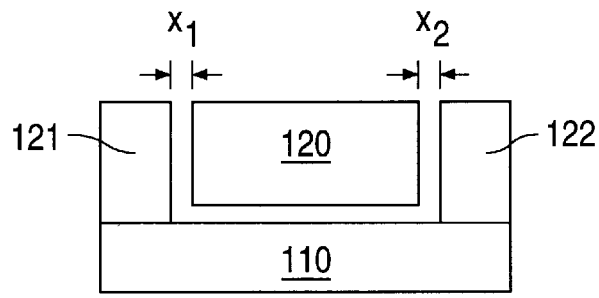
FIG. 2 shows a side view of the fine stage supported by coarse stage and e/i core actuators.

FIG. 2 shows a side view of fine stage 120 riding on coarse stage 110. (The air bearings are not shown in FIG. 2.) Complementary e/i core actuators 121 and 122 are also shown in FIG. 2, however, the e/i core actuators 123–126 are not shown in FIG. 2 for clarity. As illustrated, a gap distance $X_1$ is found between e/i actuator 121 and fine stage 120, while a gap distance $X_2$ is found between e/i actuator 122 and fine stage 120.

Figure 3:
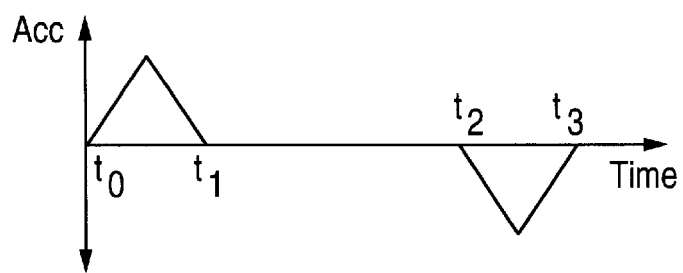
FIG. 3 is a graphic representation of the celebration in the X coordinate direction of the fine stage in relation to time.

FIG. 3 is a graphic representation of the acceleration of fine stage 120 in the X coordinate in relation to time. As shown in FIG. 3, fine stage 120 is accelerating from time t0 to t1 and is decelerating from times t2 to t3. Between times t1 and t2, fine stage 120 is at a constant velocity.

Figure 4:
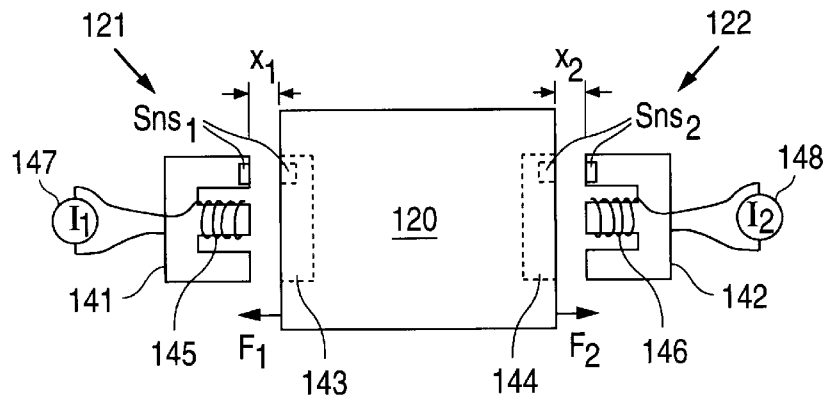
FIG. 4 shows a top view of two complementary e/i core actuators attached to a fine stage.

FIG. 4 shows a top view of complementary e/i core actuators 121 and 122 with fine stage 120. It is understood that e/i core actuators 123–126 are similar to actuators 121 and 122. The e/i core actuator 121 has a magnetic core component 141, which is shaped like a capital "E," and a bar core component 143, which is shaped like a letter "I," hence the name "e/i core actuator." The e/i core actuator 122, likewise has a magnetic core component 142 and a bar core component 144. Fine stage 120 is attached to bar core components 143, 144. Bar core components 143, 144 may be integral parts of fine stage 120 and are therefore illustrated in FIG. 4 with broken lines. The gap distances $X_1$ and $X_2$ are the distances between magnetic core components 141, 142 and respective bar core components 143, 144, which are attached to fine stage 120. The gap distances $X_1$ and $X_2$ range, for example, between approximately 0 and 400 $\mu$m (micrometers).

Additionally, e/i core actuators 121 and 122 have associated respective gap distance sensors $Sns_1$ and $Sns_2$. Gap distance sensors $Sns_1$ and $Sns_2$ sense the gap distances $X_1$ and $X_2$ between magnetic core components 141 and 142 and respective bar core components 143 and 144. Gap distance sensors $Sns_1$ and $Sns_2$ are, for example, capacitor sensors or any other sensor that can accurately measure small distances.

Magnetic core components 141 and 142 have wires 145 and 146, respectively, wound around the center prong of the "E" shape. Wires 145 and 146 are connected to respective current sources $I_1$ and $I_2$. Magnetic core components 141, 142 of respective e/i core actuators 121, 122 thereby act as electromagnets. Thus, the current that passes through wires 145 and 146, generates a magnetic force in respective magnetic core component 141, 142, as is well understood by those skilled in the art.

The forces on fine stage 120 in FIG. 4 can be expressed by the following equations:

$$F_1 = k\left(\frac{I_1}{X_1}\right)^2 \qquad \text{equ. 1}$$

$$F_2 = k\left(\frac{I_2}{X_2}\right)^2 \qquad \text{equ. 2}$$

$$\Delta F = F_1 - F_2 \qquad \text{equ. 3}$$

$$\Delta F = ma \qquad \text{equ. 4}$$

where $F_1$ and $F_2$ are the respective forces toward respective magnetic core component 141, 142 as illustrated in FIG. 4, k is a constant, $I_1$ is the D.C. current through windings 145, $I_2$ is the D.C. current through windings 146, $X_1$ and $X_2$ are the gap distances illustrated in FIG. 4 between magnetic core component 141, 142 and respective bar core component 143, 144, $\Delta F$ is the total force on fine stage 120, and m is the mass of fine stage 120, including the bar core components 143, 144, which is in this example approximately 10 kg (kilograms).

Figure 5:
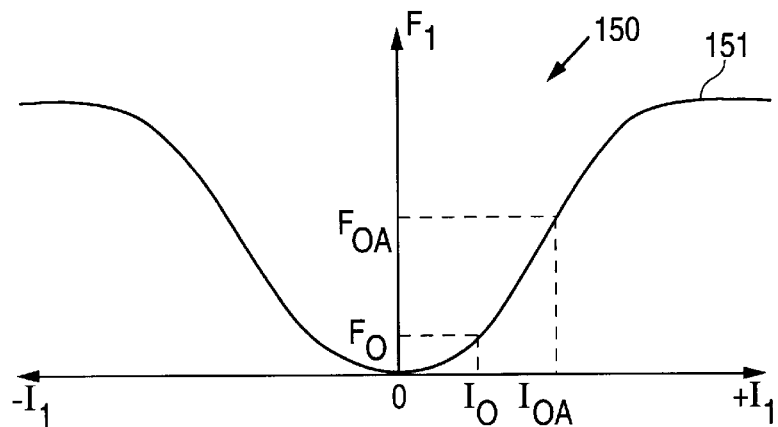
FIG. 5 is a graph illustrating the relation between current and force generated by an e/i core actuator.

FIG. 5 is a graph 150 illustrating the force generated by e/i core actuator 121 according to equation 1. The X axis in graph 150 represent the current $I_1$ through winding 145, while the Y axis represents the force $F_1$ on bar core component 143 generated by magnetic core component 141. The curve 151 in graph 150 is a graphic representation of equation 1 above, where the gap distance $X_1$ is held at a constant value.

As can be seen in FIG. 5, the curve 151 is the same for a positive current $+I_1$ or a negative current $-I_1$ because the force $F_1$ is a function of the square of the current in the windings. However, the magnetic core component 141 saturates when the current becomes large enough, which is represented by the leveling off of curve 151 at large values of $+I_1$ and $-I_2$. As illustrated by curve 151, the force on bar core component 143 is always positive, where a positive force represents a force toward magnetic core component 141. Consequently, e/i core actuator 121 moves fine stage 120 only towards itself and therefore must work in conjunction with e/i core actuator 122.

As illustrated by graph 150, an offset force $F_0$ is applied to actuator 121, shown in FIG. 4, by providing a current $I_0$ through winding 145. An offset force $F_0$ is also applied to actuator 122, shown in FIG. 4, in order to prevent undesired acceleration of fine stage 120. When the same offset force $F_0$ is applied to both e/i core actuators 121 and 122, $\Delta F$ from equation 3 is equal to zero and thus there is no net force on fine stage 120. The offset force $F_0$ applied by actuator 122 is generated by providing an appropriate current for e/i core actuator 122, which is a function of $X_2^2$ as shown in equation 2. The offset current $I_0$, for example, may be 0.2 amperes for both e/i core actuators 121 and 122 where the gap distance $X_1$ and $X_2$ are equal. The e/i core actuators 121, 122 maintain an offset force $F_0$ to prevent fine stage 120 from moving in an undesirable manner and to permit precise control over fine stage 120.

A small offset force $F_0$ adequately controls fine stage 120. Use of a larger offset force $F_0$ is disadvantageous because it produces excessive RMS power gain and heat due to the larger current required, and provides no greater control over fine stage 120 when fine stage 120 is not accelerating.

As shown by equation 4, there is a linear relationship between the net force $\Delta F$ applied to fine stage 120 and the acceleration of fine stage 120. Consequently, if a large acceleration is desired, a large net force $\Delta F$ must be applied. To apply a large net force $\Delta F$, according to equation 3, force $F_1$ must be much larger or smaller than force $F_2$.

Figure 6:
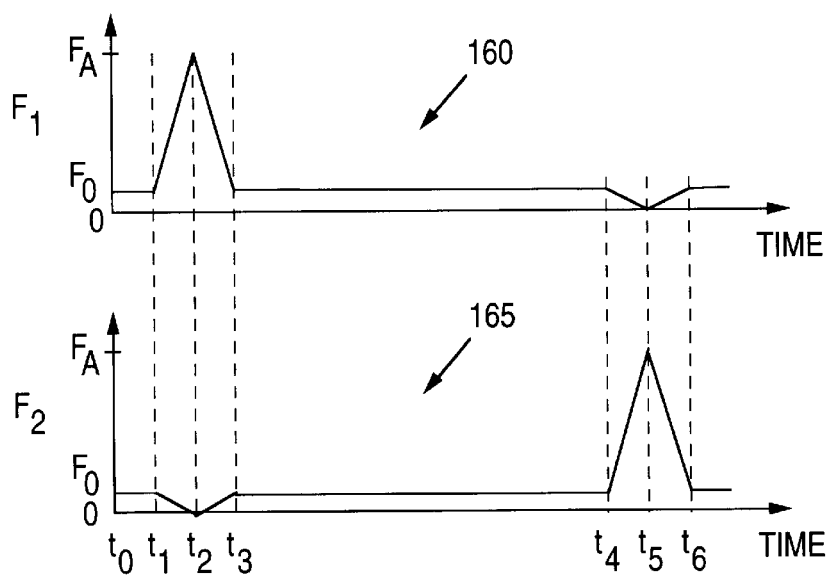
FIG. 6 graphically illustrates the forces $F_1$ and $F_2$ generated by complementary e/i core actuators on the fine stage to produce a desired acceleration.

FIG. 6 graphically illustrates the forces $F_1$ and $F_2$ generated by respective e/i core actuators 121 and 122 on fine stage 120, shown in FIG. 4, to produce a desired acceleration. The Y axis of graph 160 represents the force $F_1$ and the Y axis of graph 165 represents the force $F_2$, while the X axes of both graphs 160 and 165 represent time.

As illustrated by graphs 160 and 165, both the forces $F_1$ and $F_2$ are at the offset force value $F_0$ at time $t_0$ and thus there is no net force on fine stage 120, according to equation 3. Between times $t_1$ and $t_2$ the force $F_1$ increases until it reaches the desired acceleration force $F_A$, while during the same period the force $F_2$ decreases until it is reaches the minimum force possible, zero. Between times $t_2$ and $t_3$ the force $F_1$ decreases again until it reaches the original offset force $F_0$ while the force $F_2$ increases until it has the same offset force $F_0$. Thus, between times $t_1$ and $t_2$, fine stage 120 has a net force $\Delta F$, which produces a large acceleration on fine stage 120 until at time $t_3$ fine stage 120 has reached a desired velocity. It is understood, however, that it is not necessary for force $F_2$ to decrease to zero during this period in order to accelerate fine stage 120, and in fact, force $F_2$ can remain at the offset force $F_0$, which would result in a slightly decreased net force $\Delta F$.

Fine stage 120 maintains at a constant velocity between times $t_3$ and time $t_4$. It is understood that the period of constant velocity may be minimized by overlapping times $t_3$ and $t_4$.

At time $t_4$ the force $F_2$ begins to increase until it reaches the acceleration force $F_A$ at time $t_5$, while force $F_1$ decreases until it is at zero. Between times $t_5$ and $t_6$ the force $F_2$ decreases until it is again at the offset force $F_0$, while force $F_1$ increases back up to offset force $F_0$. Thus, between times $t_4$ and $t_6$, fine stage 120 has a net force $\Delta F$ in the opposite direction of the net force during times $t_1$ and $t_3$ and, thus, fine stage 120 decelerates.

As an alternative, the changes in forces $F_1$ and $F_2$ produced by respective e/i core actuators 121 and 122 may be in equal magnitudes but in opposite directions. Thus, where force $F_1$ is increased by an amount $\delta F$, the force $F_2$ is decreased by the same amount $\delta F$. This method is advantageous because large accelerations of fine stage 120 can be produced while simplifying the control over e/i core actuators 121, 122.

As illustrated in FIG. 5, where the offset force is held at $F_0$ the amount that force $F_1$ can decrease is limited to $F_0$, because a negative force cannot be generated. Thus, the net force $\Delta F$ is limited to twice the original offset force $F_0$ because the forces $F_1$ and $F_2$ are being changed by equal amounts but in opposite directions.

As shown in FIG. 5, however, by shifting the offset force from $F_0$ to $F_{OA}$, the offset force is higher on curve 151. Consequently, the decrease in force $F_1$ can be as large as $F_{OA}$. Thus, by driving the original offset force $F_0$ to an acceleration offset force $F_{OA}$ before changing the forces $F_1$ and $F_2$ in equal amounts but in opposite directions, a net force $\Delta F$ of up to twice the acceleration offset force $F_{OA}$ can be generated. Because a large current $I_{OA}$ through windings 145 and 146 is necessary to generate a large offset force $F_{OA}$, the associated RMS power gain makes it undesirable to maintain an acceleration offset force $F_{OA}$ for a long time period. Accordingly, the original offset force $F_0$ is maintained until acceleration of fine stage 120 is desired, at which time the offset force $F_0$ increases to the acceleration offset force $F_{OA}$. Once the necessary accelerations of fine stage 120 are complete, the system returns e/i core actuators 121, 122 to the original offset force $F_0$.

Figure 7:
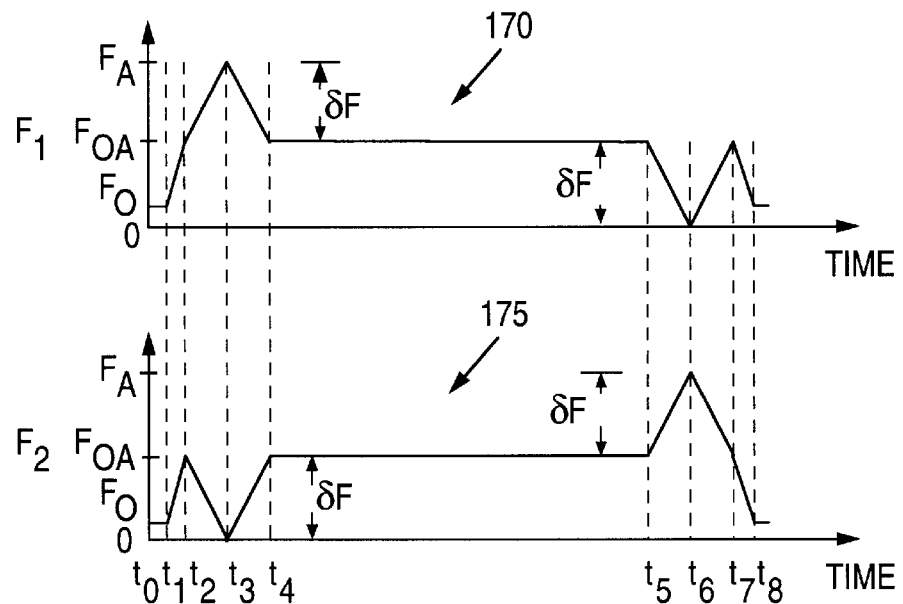
FIG. 7 graphically illustrates the forces $F_1$ and $F_2$ generated by complementary e/i core actuators on the fine stage, where forces $F_1$ and $F_2$ are equal but in opposite directions to produce a desired acceleration.

FIG. 7 graphically illustrates the method where the change in forces $F_1$ and $F_2$ are in equal amounts but in opposite directions to produce a desired acceleration. The Y axis of graph 170 represents the force $F_1$ and the Y axis of graph 175 represents the force $F_2$, while the X axes of both graphs 170 and 175 represent time.

As illustrated in graphs 170 and 175, the offset force $F_0$ on both e/i core actuators 121 and 122 is increased to an acceleration offset value $F_{OA}$ between times $t_1$ and $t_2$ and decreased between times $t_7$ and $t_8$. Because e/i core actuators 121 and 122 have the same offset force during these periods, there is no net force $\Delta F$ on fine stage 120. Between times $t_2$ and $t_4$ the force $F_1$ increases to a peak accelerating force $F_A$, and the force $F_2$ decreases to zero. As represented in graphs 170 and 175, forces $F_1$ and $F_2$ increase and decrease, respectively, during this period by the same $\delta F$, which is equal to $F_A - F_{OA}$. From time $t_4$ to time $t_5$, forces $F_1$ and $F_2$ are both at the accelerating offset force $F_{OA}$ and therefore there is no net force $\Delta F$ on fine stage 120. Thus, fine stage 120 has a constant velocity during this period. It is understood, however, that if desired the accelerating offset force $F_{OA}$ on both e/i core actuators 121, 121 may be simultaneously decreased to the original offset force $F_0$ between times $t_4$ and time $t_5$, thereby decreasing power consumption.

At time $t_5$ the decelerating period begins, with force $F_1$ decreasing to zero and force $F_2$ increasing to $F_A$ and both returning to the accelerating offset force $F_{OA}$ at time $t_7$. The forces $F_1$ and $F_2$ then simultaneously decrease to the original offset force $F_0$ between times $t_7$ and $t_8$.

Figure 8:
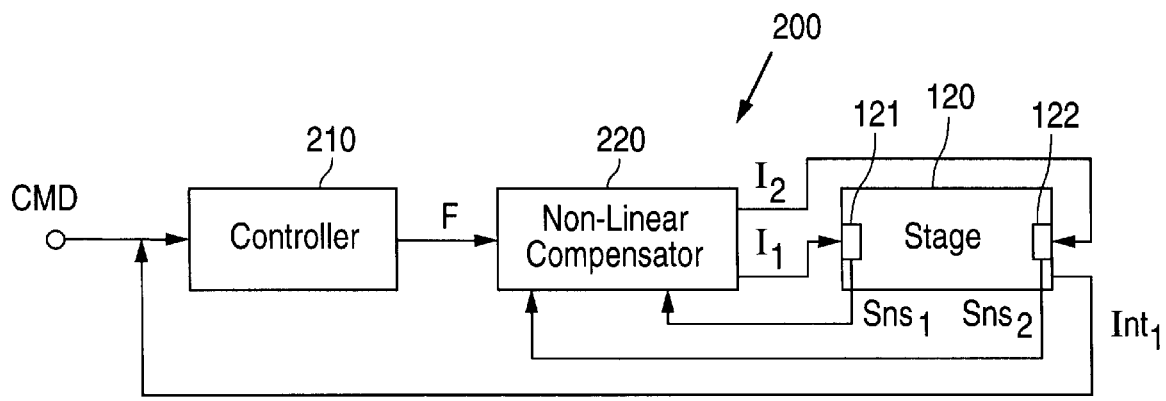
FIG. 8 is a block diagram of a fine stage control system for controlling a fine stage in accordance with the present invention.

FIG. 8 is a block diagram of a fine stage control system 200 for controlling motion of fine stage 120. Fine stage control system 200 controls e/i core actuators attached to fine stage 120, for example, e/i core actuators 121 and 122. Thus, if motion of fine stage 120 is controlled by six e/i core actuators, for instance, as shown in FIG. 1, three fine stage control systems similar to control system 200 are used. Fine stage control system 200 receives a command signal from an external source (not shown) such as a digital signal processor or micro-processor via terminal CMD. The command signal indicates the desired position of fine stage 120.

The command signal on terminal CMD is received by a controller circuit 210, such as a conventional proportionalintegration-derivative ("PID") circuit. Controller circuit 210 generates a force signal F indicating the force required to produce the necessary acceleration to drive fine stage 120 to the desired position. Using a controller circuit 210 to generate a force signal based on a signal indicating the desired position is well within the skill of those in the art.

A non-linear compensator circuit 220, such as a digital signal processor or micro-processor is connected to controller circuit 210. Non-linear compensator circuit 220 receives the force signal from controller circuit 210 and provides the electric currents $I_1$ and $I_2$ needed by windings 145 and 146, respectively, to produce the desired net force on stage 120 according to the following equations:

$$I_1 = \frac{X_1}{k}\sqrt{F_1} \qquad \text{equ. 5}$$

$$I_2 = \frac{X_2}{k}\sqrt{F_2} \qquad \text{equ. 6}$$

where the units are the same as those described in reference to equations 1 and 2. Non-linear compensator circuit 220 is also connected to gap distance sensors $Sns_1$ and $Sns_2$ which provide signals indicating the respective gap distances $X_1$ and $X_2$ required by equations 5 and 6.

The e/i core actuators 121 and 122 of fine stage 120 are connected to the output terminals of non-linear compensator circuit 220. The currents $I_1$ and $I_2$ provided by non-linear compensator circuit 220 generate the appropriate net force to accelerate fine stage 120 in the desired manner, as described above. As shown in FIG. 4, gap distance sensors $Sns_1$ and $Sns_2$ are connected to e/i core actuators 121 and 122. Gap distance sensor $Sns_1$ provides a feedback signal to non-linear compensator 235 indicating the distance $X_1$ in e/i core actuator 121, while gap distance sensor $Sns_2$ likewise provides a feedback signal indicating the distance $X_2$ in e/i core actuator 122.

A position sensor $Int_1$ (shown in FIG. 1) is also connected to fine stage 120. Position sensor $Int_1$ senses the actual location of fine stage 120 and provides a feedback signal, which is combined with the command signal prior to controller circuit 210. Position sensor $Int_1$ is an interferometer, but may be any other accurate measuring device, such as a linear encoder.

Figure 9:
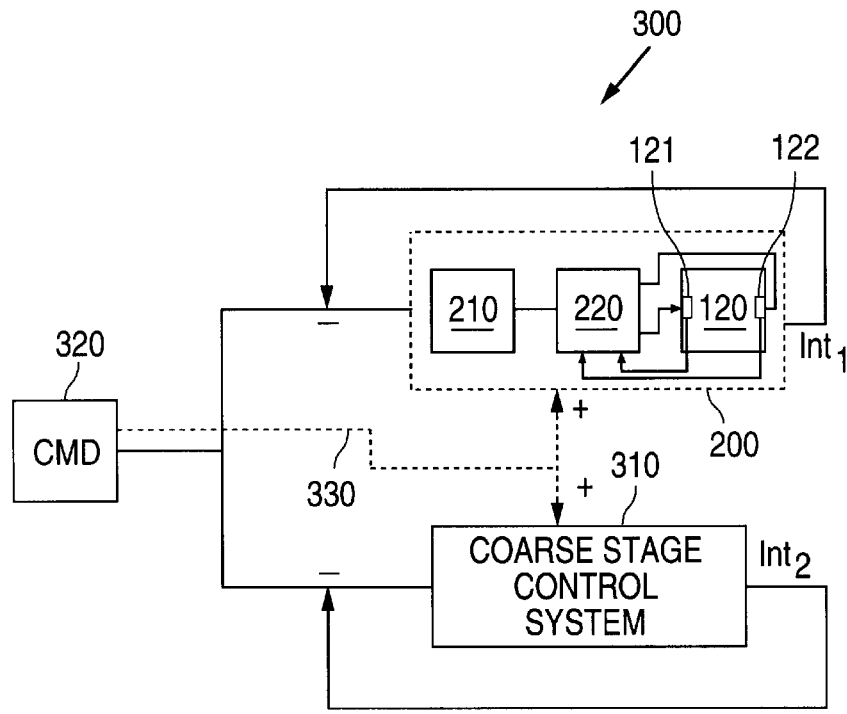
FIG. 9 is a block diagram of a control system for controlling the position of the high-precision positioning instrument in accordance with the present invention.

FIG. 9 is a block diagram of a control system 300 for controlling the position of the high-precision positioning instrument 100 (shown in FIG. 1) in accordance with the present invention. Control system 300 includes fine stage control system 200 as described above and a coarse stage control system 310. Coarse stage control system 310 may be a conventional coarse stage control system for controlling coarse stage 110 shown in FIG. 1, as is well known to those skilled in the art. Control system 300 is used to control the motion of high-precision positioning instrument 100 along one coordinate direction, for example the X coordinate direction, as shown in FIG. 1. A second control system is necessary to control the motion of high-precision positioning instrument 100 in an orthogonal direction, for example the Y coordinate direction, as shown in FIG. 1.

In control system 300, a command circuit 320, such as a digital signal processor or micro-processor generates a command signal indicating the desired position of fine stage 200. The command signal is provided to both fine stage control system 200 and coarse stage control system 310. Fine stage control system 200 controls the movement of fine stage 120 as described above. The distance sensor Int1 produces a position signal indicating the actual position of fine stage 120. The position signal from sensor Int1 is combined with the command signal prior to fine stage control system 200, and the difference is received by fine stage control system 200.

The command signal is also received by coarse stage control system 310. Distance sensor $Int_2$ is connected to coarse stage 110 as shown in FIG. 1 and provides a position signal indicating the actual position of coarse stage 110. The coarse stage position signal is combined with the command signal prior to coarse stage control system 310, and the difference is received and processed by coarse stage control system 310.

Command circuit 320 also provides a feedforward force signal to both fine stage control system 200 and coarse stage control system 310 via line 330. As is understood by those skilled in the art, the feedforward force signal is used by fine stage control system 200 and coarse stage control system 310 to increase the acceleration of the system to the desired velocity, thus reducing settling time. Consequently, the through put of the system is increased.

Figure 10:
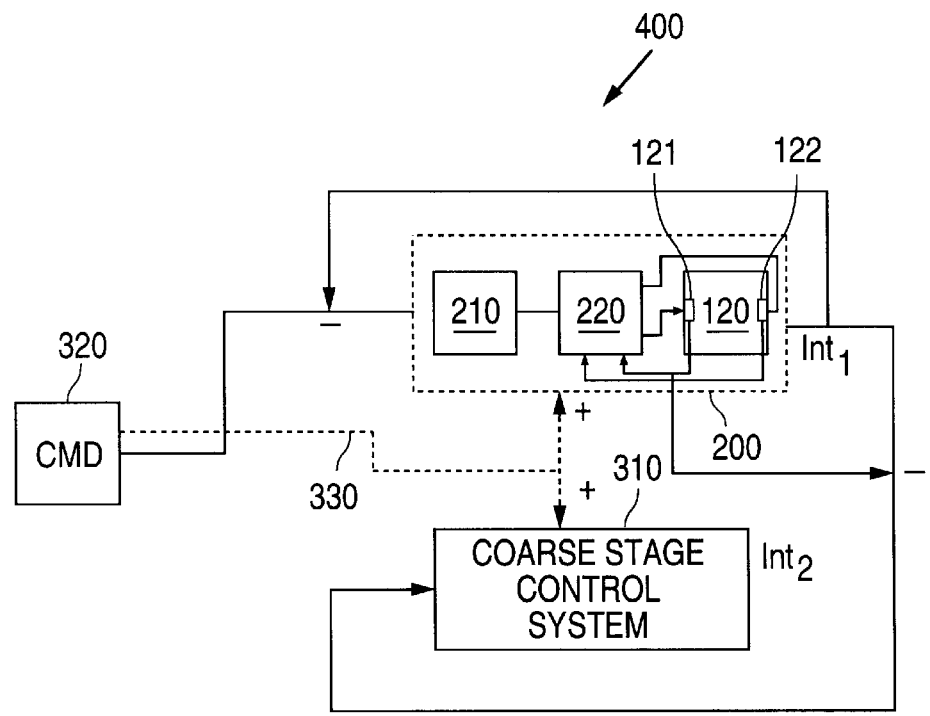
FIG. 10 is a block diagram of an alternative embodiment of a control system for controlling the position of the high-precision positioning instrument in accordance with the present invention.

FIG. 10 is a block diagram of an alternative embodiment of a control system 400 in accordance with the present invention. Control system 400 is similar to control system 300, like-numbered elements being the same. However, command circuit 320 in control system 400 does not provide a command signal directly to coarse stage control system 310.

As shown in FIG. 10, fine stage control system 200 receives the command signal from command circuit 320 and accordingly moves fine stage 120 as described above. Position sensor $Int_1$ provides a position feedback signal for fine stage control system 200 as well as providing a position signal for coarse stage control system 310. Gap distance sensor $Sns_1$, as shown in FIG. 8, measures the gap distance $X_1$ of e/i core actuator 121 and provides a distance signal to non-linear compensator 220 as described above. Gap distance sensor $Sns_1$ also provides a distance signal to be compared with the position signal from position sensor $Int_1$. The difference between the distance signal and position signal is then received by coarse stage control system 310. Coarse stage control system 310 moves coarse stage 110 as necessary to maintain an appropriate gap distance, i.e., less than 400 $\mu$m. Consequently, fine stage control system 200 moves according to the command signal from command circuit 320 and coarse stage control system 310 moves as necessary to maintain the gap distance. Accordingly, control system 400 obviates the need for position sensor $Int_2$ (shown in FIG. 1) on coarse stage 110.

Although the present invention has been described in considerable detail with reference to certain versions thereof, other versions are possible. For example, one e/i core actuator may be used to provide a force on a fine stage in one direction, while a force is applied in the opposite direction by a spring, gravity, or other such source. Moreover, different positioning devices may be used to determine the precise location of the fine stage or the position of fine stage relative to the coarse stage. Also, some components are shown directly connected to one another while others are shown connected via intermediate components. In each instance the method of interconnection establishes some desired electrical communication between two or more circuit nodes. Such communication may often be accomplished using a number of circuit configurations, as will be understood by those of ordinary skill in the art. Therefore, the spirit and scope of the appended claims should not be limited to the description of the versions depicted in the figures.

What is claimed is:

1. An apparatus comprising:
   a stage;
   a first actuator including a first portion connected with said stage and a second portion movable with respect to said first portion, said first actuator accelerating said stage in a first direction;
   a first gap distance sensor that generates a first gap distance signal indicating a gap distance between said first and second portions of said first actuator;
   a first position sensor that produces a first position signal indicating the position of said stage; and
   a stage control circuit connected with said first actuator, said first gap distance sensor, and said first position sensor, said stage control circuit controlling said first actuator, said stage control circuit controlling said first actuator by receiving said first gap distance signal as a first feedback loop and receiving said first position signal as a position feedback loop.

2. The apparatus of claim 1, wherein said stage control circuit comprises:
   a controller circuit receiving a command signal indicating the desired position of said stage, said controller circuit providing a force signal;
   a non-linear compensator circuit coupled to said controller circuit and coupled to said first gap distance sensor, said non-linear compensator circuit receiving said force signal, said non-linear compensator circuit providing a first current to said first actuator; and
   wherein said position feedback loop is received prior to said controller circuit, and said first gap distance feedback loop is received by said non-linear compensator circuit.

3. The apparatus of claim 1, further comprising:
   a second actuator including a first portion connected with said stage and a second portion movable with respect to said first portion, said second actuator accelerating said stage in a second direction, wherein said first direction and said second direction are opposing directions;
   a second gap distance sensor that generates a second gap distance signal indicating a gap distance between said first and second portions of said second actuator; and
   wherein said stage control circuit is connected with said second gap distance sensor and said second actuator, said stage control circuit controlling said second actuator by receiving said second gap distance signal as a second feedback loop and receiving said first position signal as a position feedback loop.

4. The apparatus of claim 3, wherein said first actuator and second actuator are e/i core actuators.

5. The apparatus of claim 3, wherein said first actuator and second actuator are voice coil motors.

6. The apparatus of claim 3, wherein said stage control circuit provides a first current to said first actuator generating a first force on said stage, and provides a second current to said second actuator generating a second force on said stage.

7. The apparatus of claim 6, wherein:
   said first force and said second force on said stage are equal offset forces during a first time period prior to acceleration of said stage;
   said first force increases up to an acceleration force and decreases back to the offset force during a second time period when said stage is accelerated to a desired velocity;
   said second force increases up to said acceleration force and decreases back to the offset force during a third time period when said stage decelerates from said desired velocity; and
   wherein said second time period and said third time period are approximately equal in duration.

8. The apparatus of claim 7, wherein:
   said second force decreases below the offset force and back up to the offset force during said second time period; and
   said first force decreases below the offset force and back up to the offset force during said third time period.

9. The apparatus of claim 6, wherein:
   said first force and said second force on said stage are equal offset forces during a first time period prior to acceleration of said stage;
   said first force and said second force on said stage are simultaneously increased to an acceleration offset force during a second time period prior to acceleration of said stage;
   said first force increases to an acceleration force and said second force simultaneously decreases by said acceleration force during a third time period;
   said first force decreases to said acceleration offset force and said second force simultaneously increases to said acceleration offset force during a fourth time period;
   wherein during said third and fourth time periods, said stage accelerates to a desired velocity;
   said second force increases to said acceleration force and said first force simultaneously decreases by said acceleration force during a fifth time period;
   said second force decreases to said acceleration offset force and said first force simultaneously increases to said acceleration offset force during a sixth time period;
   wherein during said fifth and sixth time periods, said stage decelerates from said desired velocity; and
   said first force and said second force are simultaneously decreased to said equal offset forces during a seventh time period.

10. The apparatus of claim 9, wherein between said third time period and said fourth time period said first force and said second force are simultaneously decreased to said equal offset force and increased back to said acceleration offset force.

11. The apparatus of claim 3, wherein said stage control circuit comprises:
    a controller circuit receiving a command signal indicating the desired position of said stage, said controller circuit providing a force signal;
    a non-linear compensator circuit coupled to said controller circuit and coupled to said first gap distance sensor and said second gap distance sensor, said non-linear compensator circuit receiving said force signal, said non-linear compensator circuit providing a first current to said first actuator and a second current to said second actuator; and
    wherein said position feedback loop is received prior to said controller circuit, and said first gap distance feedback loop and said second gap distance feedback loop is received by said non-linear compensator circuit.

12. The apparatus of claim 3, further comprising:
    a coarse stage coupled to said stage on which said stage rides and to which said first and second actuators are also coupled; and
    a coarse stage control circuit coupled to said coarse stage, said coarse stage control circuit controlling the position of said coarse stage.

13. The apparatus of claim 12, further comprising:
a second position sensor that senses the position of said coarse stage and produces a second position signal indicating the position of said coarse stage;
a command circuit connected to said coarse stage control circuit and said stage control circuit, said command circuit providing a desired position signal to said coarse stage control circuit, said desired position signal indicating the desired position of said coarse stage and said stage; and
wherein said coarse stage control circuit receives said second position signal as a second position feedback loop.

14. The apparatus of claim 13, wherein said command circuit further provides a feedforward command signal to said stage control circuit and said coarse stage control circuit, said stage control circuit receiving the sum of said feedforward command signal and said desired position signal and said coarse stage control circuit receiving the difference between said feedforward command signal and said desired position signal.

15. The apparatus of claim 12, further comprising:
a command circuit coupled to said stage control circuit, said command circuit providing a desired position signal to said stage control circuit indicating the desired position of said stage;
wherein said first position sensor is coupled to said coarse stage control circuit, said first position sensor provides said first position signal to said coarse stage control circuit; and
wherein said first gap distance sensor is coupled to said first position sensor in a third feedback loop, said coarse stage control circuit receiving a second desired position signal indicating the desired position of said coarse stage, said second desired position signal reflecting the difference between said first position signal and said first gap distance signal.

16. The apparatus of claim 15, wherein said command circuit further provides a feedfoward command signal to said stage control circuit and said coarse stage control circuit, said stage control circuit receiving the sum of said feedforward command signal and said desired position signal and said coarse stage control circuit receiving the difference between said feedforward command signal and said second desired position signal.

17. A method of driving a stage comprising the steps of:
providing a command signal indicating a desired position of the stage moved by a first actuator that includes a first portion connected with said stage and a second portion movable with respect to said first portion;
providing a position signal indicating a position of said stage;
providing a first gap distance signal indicating a gap distance between said first and second portions of said first actuator;
combining said command signal with said position signal to obtain a controller input signal; and
controlling said first actuator to provide a first force on said stage in response to said controller input signal and said first gap distance signal.

18. The method of claim 17, wherein said stage is moved by said first actuator and a second actuator that includes a first portion connected with said stage and a second portion movable with respect to said first portion, and further comprising:

providing a second gap distance signal indicating a gap distance between said first and second portions of said second actuator; and
controlling said second actuator to provide a second force on said stage in response to said controller input signal and said second gap distance signal, wherein said first force and said force are opposing forces.

19. The method of claim 18, wherein:
said controlling said first actuator to provide a first force on said stage comprises providing a first current to said first actuator; and
said controlling a second actuator to provide a second force on said stage comprises providing a second current to said second actuator.

20. The method of claim 18, wherein:
said first force and said second force on said stage are equal offset forces during a first time period prior to accelerating said stage;
said first force increases up to an acceleration force and decreases back to the offset force during a second time period when said stage accelerates to a desired velocity;
said second force increases up to said acceleration force and decreases back to the offset force during a third time period when said stage decelerates from said desired velocity; and
wherein said second time period and said third time period are approximately equal in duration.

21. The method of claim 20, wherein:
said second force decreases below the offset force and back up to the offset force during said second time period; and
said first force decreases below the offset force and back up to the offset force during said third time period.

22. The method of claim 18, wherein:
said first force and said second force on said stage are equal offset forces during a first time period prior to accelerating said stage;
said first force and said second force on said stage are simultaneously increased to an acceleration offset force during a second time period prior to accelerating said stage;
said first force increases to an acceleration force and said second force simultaneously decreases by said acceleration force during a third time period;
said first force decreases to said acceleration offset force and said second force simultaneously increases to said acceleration offset force during a fourth time period;
wherein during said third and fourth time periods, said stage accelerates to a desired velocity;
said second force increases to said acceleration force and said first force simultaneously decreases by said acceleration force during a fifth time period;
said second force decreases to said acceleration offset force and said first force simultaneously increases to said acceleration offset force during a sixth time period;
wherein during said fifth and sixth time periods, said stage decelerates from said desired velocity; and
said first force and said second force are simultaneously decreased to said equal offset forces during a seventh time period.

23. The method of claim 22, wherein between said third time period and said fourth time period said first force and said second force are simultaneously decreased to said equal offset force and increased back to said acceleration offset force.

24. The method of claim 18, further comprising:

combining said position signal and said first gap distance signal;

providing a second controller input signal reflecting the difference between said position signal and said first gap distance signal to a coarse stage coupled to said stage; and controlling said coarse stage in response to said second controller input signal.

25. The method of claim 20, further comprising:

providing a feedforward command signal;

controlling said stage in response to the sum of said feedforward command signal and said controller input signal; and controlling said coarse stage in response to the difference between said feedfoward command signal and said second controller input signal.

26. The method of claim 18, further comprising:

providing a second position signal indicating the position of a coarse stage coupled to said stage;

combining said command signal with said second position signal to obtain a second controller input signal; and controlling said coarse stage in response to said second controller input signal.

27. The method of claim 26, further comprising:

providing a feedforward command signal;

controlling said stage in response to the sum of said feedforward command signal and said controller input signal; and controlling said coarse stage in response to the difference between said feedforward command signal and said second controller input signal.

* * * * *

UNITED STATES PATENT AND TRADEMARK OFFICE
CERTIFICATE OF CORRECTION

PATENT NO. : 6,130,517
ISSUE DATE : October 10, 2000
INVENTOR(S) : Bausan Yaun and Ting-Chien Teng It is certified that error appears in the above-identified patent and that said Letters Patent is hereby corrected as shown below:

[73] Assignee: Nikon Corporation, Tokyo, Japan

Signed and Sealed this

Twenty-ninth Day of May, 2001

Attest:

NICHOLAS P. GODICI

Attesting Officer     Acting Director of the United States Patent and Trademark Office